US012105126B2

(12) United States Patent
Yang

(10) Patent No.: US 12,105,126 B2
(45) Date of Patent: Oct. 1, 2024

(54) ELECTRONIC DEVICE AND PHASE DETECTOR

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/208,474

(22) Filed: Jun. 12, 2023

(65) Prior Publication Data

US 2024/0044957 A1   Feb. 8, 2024

Related U.S. Application Data

(62) Division of application No. 17/881,822, filed on Aug. 5, 2022, now Pat. No. 12,038,462.

(51) Int. Cl.
*G01R 25/00* (2006.01)
*H03K 17/687* (2006.01)

(52) U.S. Cl.
CPC ......... *G01R 25/00* (2013.01); *H03K 17/6871* (2013.01)

(58) Field of Classification Search
CPC ....... G01R 25/00; G01R 25/005; G01R 25/04
USPC ...................... 324/76.77; 327/2–12
See application file for complete search history.

(56) References Cited

U.S. PATENT DOCUMENTS

| 6,326,826 B1 | 12/2001 | Lee et al. |
| 2007/0103183 A1* | 5/2007 | Miller ............ H03H 11/126 324/754.07 |
| 2022/0140832 A1 | 5/2022 | Song et al. |
| 2023/0318608 A1* | 10/2023 | Uehara ............ H03K 5/26 327/291 |

FOREIGN PATENT DOCUMENTS

| EP | 1601130 A2 | 11/2005 |
| TW | 200805892 A | 1/2008 |
| TW | 201826714 A | 7/2018 |
| TW | 202141932 A | 11/2021 |

OTHER PUBLICATIONS

Office Action and Search Report mailed on Feb. 5, 2024 related to Taiwanese Application No. 112113657.
Office Action and Search Report mailed on Mar. 8, 2024 related to Taiwanese Application No. 112146864.
Office Action and Search Report mailed on Apr. 12, 2024 related to U.S. Appl. No. 17/881,822, wherein this application is a DIV of U.S. Appl. No. 17/881,822.

\* cited by examiner

*Primary Examiner* — Eman A Alkafawi
*Assistant Examiner* — Rahul Maini
(74) *Attorney, Agent, or Firm* — Xuan Zhang

(57) ABSTRACT

An electronic device and phase detector are provided. The phase detector includes a first input terminal, a second input terminal, a first input buffer, and a second input buffer. The first input buffer is electrically connected to the first input terminal. The second input buffer is electrically connected to the second input terminal.

7 Claims, 7 Drawing Sheets

ELECTRONIC DEVICE AND PHASE DETECTOR

CROSS-REFERENCE TO RELATED APPLICATION

This application is a divisional application of U.S. Non-Provisional Application Ser. No. 17/881,822 filed 5 Aug. 2022, which is incorporated herein by reference in its entirety.

TECHNICAL FIELD

The present disclosure relates to an electronic device, and more particularly, to an electronic device including a phase detector.

DISCUSSION OF THE BACKGROUND

An electronic device may be configured to output a plurality of clocks for various parts of an integrated circuit based on a reference clock. The electronic device may include a phase detector for controlling the phase of the output clocks. However, any imbalance in the phase detector can affect function.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a phase detector including a first input terminal, a second input terminal, a first input buffer, and a second input buffer. The first input buffer is electrically connected to the first input terminal. The second input buffer is electrically connected to the second input terminal.

Another aspect of the present disclosure provides a phase detector including a first input buffer, a second input buffer, a first input terminal, a second input terminal, and a first equalizer. The first input buffer is configured to receive a feedback signal and generate a first signal and a second signal. The second input buffer is configured to receive a reference signal and generate a third signal. The second input terminal is configured to receive the third signal. The first equalizer is configured to receive the second signal.

Another aspect of the present disclosure provides an electronic device including a receiver, a delay line, a data output port, and a phase detector. The receiver is configured to receive a reference clock signal and generate a first signal and a reference signal. The delay line is electrically connected to the receiver and configured to adjust the phase of the first signal to generate a second signal. The data output port is electrically connected to the delay line and provides a feedback signal associated with the second signal. The phase detector is electrically connected to the data output port and the delay line. The phase detector a first input terminal, a second input terminal, a first input buffer, and a second input buffer. The first input buffer is electrically connected to the first input terminal and configured to receive the feedback signal. The second input buffer is electrically connected to the second input terminal and configured to receive the reference signal.

The phase detector of the present disclosure includes a first transistor having a first input buffer electrically connected to a first input terminal and a second input buffer electrically connected to a second input terminal. The phase detector is configured to determine whether the phase of a feedback signal is ahead of or later than the phase of a reference signal. The feedback signal and the reference signal have the same frequency but different phases. The first input buffer is configured to receive the feedback signal and the second input buffer is configured to receive the reference signal. The second input buffer is configured to generate a third signal for the second input terminal based on the reference signal. The first input buffer is configured to, based on the feedback signal, generate a first signal for the first input terminal and a second signal for other transistors (e.g., equalizers) of the phase detector. By generating two individual signals (the first signal and the second signal), the first input terminal is decoupled from other transistors in the phase detector. Therefore, the input impedance at the first input terminal and the input impedance at the second input terminal are the same. Imbalance between the first input terminal and the second input terminal can be alleviated or eliminated. The phase detector determines whether the phase of the first signal is ahead of or later than the phase of the third signal. This determination directly indicates which of the feedback signal and the reference signal is earlier. The phase detector of the present disclosure can correctly provide an output signal to the next stage (e.g., a delay line controller) to adjust the delay of output clocks.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
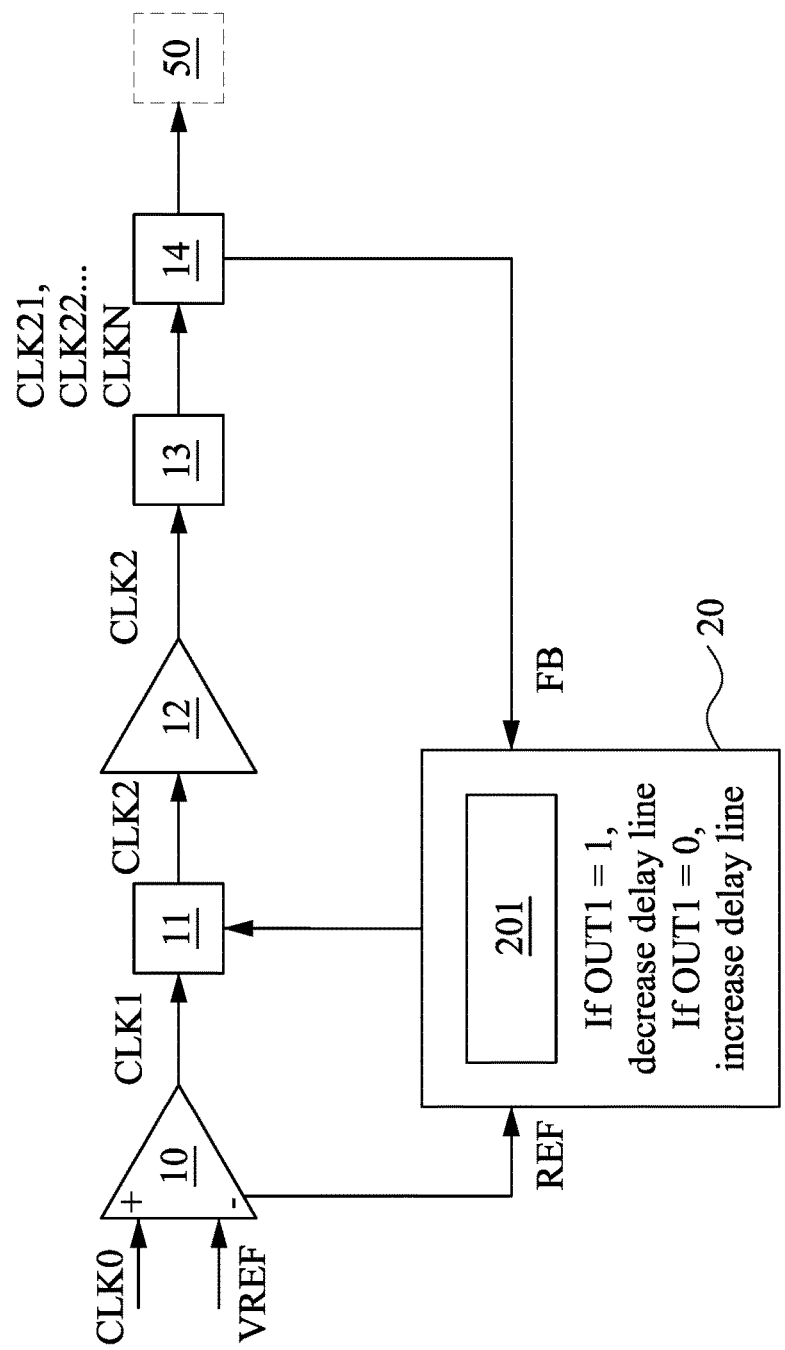
FIG. 1 is a block diagram of an electronic device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of an electronic device 100 in accordance with some embodiments of the present disclosure. The electronic device 100 includes a reference clock receiver 10, a delay line 11, an amplifier 12, a clock tree 13, a data output port 14, and a phase detector 20. The reference clock receiver 10 is electrically connected to the delay line 11. The delay line 11 is electrically connected to the clock tree 13. The clock tree 13 is electrically connected to the data output port 14. The data output port 14 is electrically connected to the phase detector 20. The phase detector 20 is electrically connected to the delay line 11.

The electronic device 100 may be a delay-locked loop (DLL) configured to provide one or more clock signals to an integrated circuit 50. The integrated circuit 50 is denoted by a dashed line, indicating that the electronic device 100 may not include the integrated circuit 50. In alternative embodiments, the integrated circuit 50 and the electronic device 100 may be integrated into a system and communicate via wirings or buses.

The reference clock receiver 10 is configured to receive a reference clock signal CLK0 and a reference voltage signal VREF. The reference clock receiver 10 acts as a buffer of the electronic device 100 to receive the reference clock signal CLK0. The reference clock receiver 10 may include a differential amplifier. The reference clock receiver 10 is configured to generate a clock signal CLK1 in response to the reference clock CLK0. The clock signal CLK1 may have a phase later than a phase of the reference clock signal CLK0 owing to delay caused by the reference clock receiver 10.

The delay line 11 is configured to receive the clock signal CLK1. The delay line 11 may be configured to adjust the phase of the clock signal CLK1. In some embodiments, the delay line 11 may include a plurality of delay cells connected in series. The delay line 11 may be configured to adjust the phase of the clock signal CLK1 by controlling the number of delay cells that the clock signal CLK1 passes. The more delay cells that the clock signal CLK1 passes, the more delayed the phase of the clock signal CLK1 will be, and vice versa. The delay cells of the delay line 11 may include buffers. The delay line 11 is configured to generate a clock signal CLK2 in response to the clock signal CLK1 and the control signal from the phase detector 20, which is discussed in detail later.

The amplifier 12 is configured to receive the clock signal CLK2. The amplifier is configured to boost the clock signal CLK2, such that the clock signal CLK2 has sufficient signal strength for the next stage (e.g., the clock tree 13).

The clock tree 13 is configured to receive the clock signal CLK2. The clock tree 13 is configured to distribute a global clock signal (e.g., the clock signal CLK2) to various parts of the integrated circuit 50. The clock tree 13 may include multistage repeat buffers to distribute the clock signal CLK2 and isolate the loading of each part of the integrated circuit 50 from a source (e.g., the clock signal CLK2). In some embodiments, the clock tree 13 may produce one or more clock signals CLK21, CLK22 . . . CLK2N to the data output port 14 based on the clock signal CLK2, wherein N is a positive integer.

The data output port 14 is configured to receive the one or more clock signals CLK21, CLK22 . . . CLK2N. The data output port 14 may include a plurality of pins electrically connected to various parts of the integrated circuit 50. The data output port 14 may be configured to transmit the one or more clock signals CLK21, CLK22 . . . CLK2N to the various parts of the integrated circuit 50 through the plurality of pins. The data output port 14 may be configured to provide one of the one or more clock signals CLK21, CLK22 . . . CLK2N as a feedback signal FB to the phase detector 20. The feedback signal FB may be associated with the clock signal CLK2.

The phase detector 20 is configured to receive a feedback signal (or a first signal) FB from the data output port 14. The phase detector 20 is configured to receive a reference signal (or a second signal) REF from the reference clock receiver 20. The reference signal REF may be associated with the reference clock signal CLK0. The frequency of feedback signal FB and that of the reference signal REF may be the same. The phase detector 20 may include a delay line controller 201. In alternative embodiments, the delay line controller 201 may be separated from the phase detector 20.

The phase detector 20 is configured to determine whether a phase of the feedback signal FB is ahead of or later than a phase of the reference signal REF. The phase detector 20 is configured to compare the phase of the feedback signal FB and the phase of the reference signal REF. If it is determined that the phase of the feedback signal FB is ahead of the phase of the reference signal REF, the phase detector 20 produces an output signal OUT1 with a first value (e.g., logic low value, "0") to the delay line 11. In response to the output signal OUT1, the delay line controller 201 is configured to control the delay line 11 to increase the delay of the phase of the clock signal CLK2. In some embodiments, the delay line controller 201 is configured to increase the delay cells (of the delay line 11) that the clock signal CLK1 passes before being output as the clock signal CLK2.

If it is determined that the phase of the feedback signal FB is later than the phase of the reference signal REF, the phase detector 20 produces the output signal OUT1 with a second value (e.g., logic high value, "1") to the delay line 11. In response to the output signal OUT1, the delay line controller 201 is configured to control the delay line 11 to decrease the delay of the phase of the clock signal CLK2. In some embodiments, the delay line controller 201 is configured to decrease the delay cells (of the delay line 11) that the clock signal CLK1 passes before being output as the clock signal CLK2.

If the phase of the feedback signal FB and the phase of the reference signal REF are the same, the delay line controller 201 is configured to control the delay line to retain the delay of the phase of the clock signal CLK2.

In some embodiments, the delay line controller 201 may include a shift register, a counter, a successive approximation register (SAR) counter, or the like.

In some embodiments, the electronic device 100 may further include a low-pass filter (not shown) between the phase detector 14 and the delay line 11 to screen out noise at high frequencies.

Figure 2:
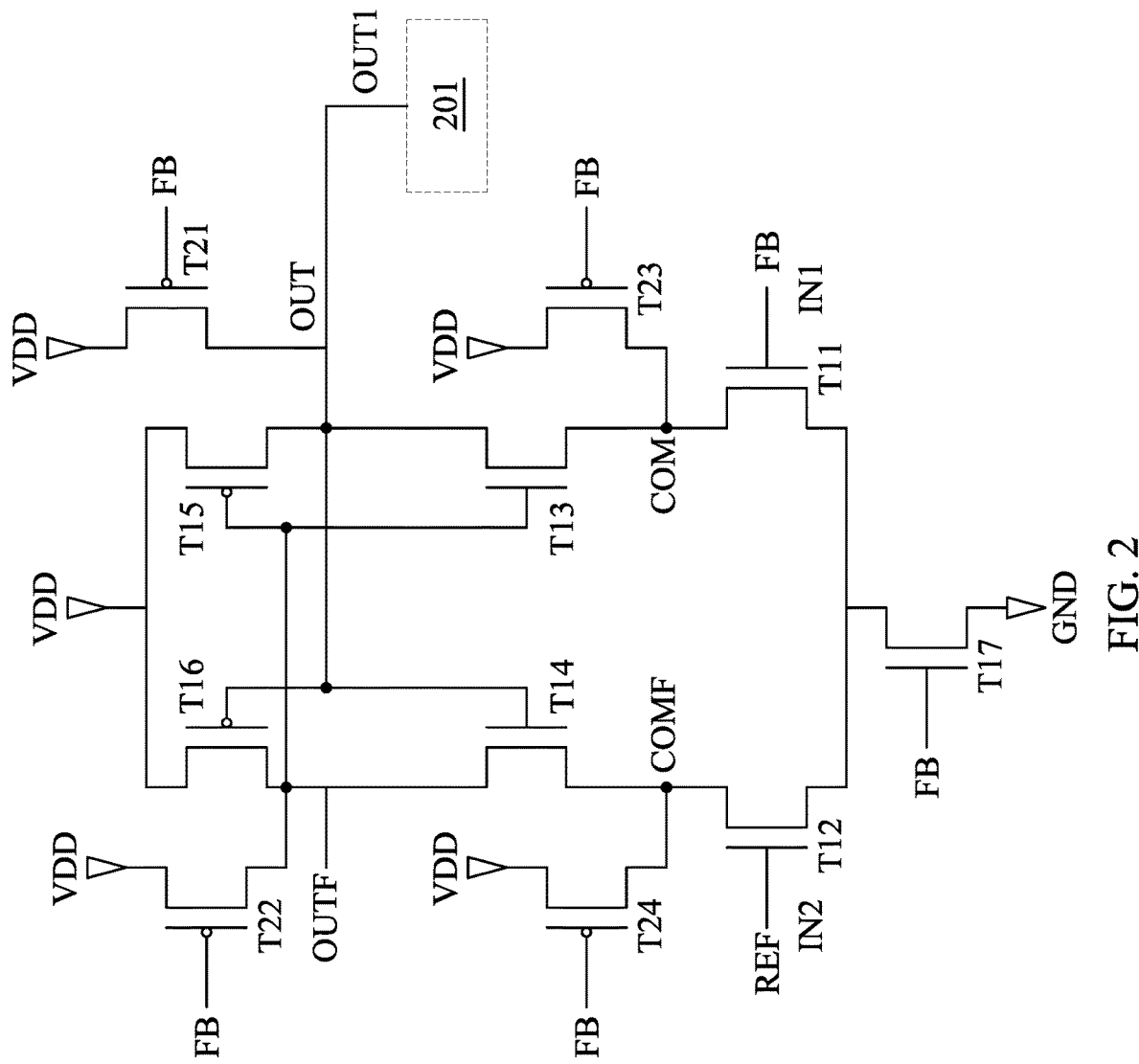
FIG. 2 is a schematic diagram of a phase detector in accordance with some embodiments of the present disclosure.

FIG. 2 is a schematic diagram of the phase detector 20 in accordance with some embodiments of the present disclosure. The phase detector 20 includes transistors T11, T12, T13, T14, T15, T16, T17, T21, T22, T23, and T24. The transistors T11, T12, T13, T14, T15, T16, T17, T21, T22, T23, and T24 may each include a MOS field-effect transistor (FET). The transistors T11, T12, T13, T14, T15, T16, T17, T21, T22, T23, and T24 may each include a p-type MOSFET or an n-type MOSFET. The exemplary transistor as shown in FIG. 2 for the transistor T11, T12, T13, T14, or T17 will be an n-type MOSFET. The exemplary transistor as shown in FIG. 2 for the transistor T15, T16, T21, T22, T23, or T24 will be a p-type MOSFET.

The transistor T11 has a gate as a first input terminal IN1 configured to receive the feedback signal (or a first signal) FB. The transistor T11 has a source electrically connected to a ground GND through the transistor T17. The transistor T11 has a drain electrically connected to a source of the transistor T13. The drain of the transistor T11 may be electrically connected to a drain of the transistor T23. The node to which the drain of the transistor T11, the source of the transistor T13, and the source of the transistor T23 are connected is referred to as a first comparison node COM.

The transistor T12 has a gate as a second input terminal IN2 configured to receive the reference signal (or a second signal) REF. The transistor T12 has a source electrically connected to the ground GND through the transistor T17. The transistor T12 has a drain electrically connected to a source of the transistor T14. The drain of the transistor T12 may be electrically connected to a drain of the transistor T24. The node to which the drain of the transistor T12, the source of the transistor T14, and the source of the transistor T24 are connected is referred to as a second comparison node COMF.

The transistor T17 has a gate configured to receive the feedback signal FB, a drain electrically connected to the source of the transistor T11 and the source of the transistor T12, and a source electrically connected to the ground GND. The transistor T17 may be configured as a current source.

The transistor T13 has a gate electrically connected to a gate of the transistor T15, the source electrically connected to the drain of the transistor T11, and a drain as a first output terminal OUT of the phase detector 20. The transistor T14 has a gate electrically connected to a gate of the transistor T16, the source electrically connected to the drain of the transistor T12, and a drain as a second output terminal OUTF of the phase detector 20. The gate of the transistor T13 is electrically connected to the second output terminal OUTF. The gate of the transistor T14 is electrically connected to the first output terminal OUT.

The transistor T15 has a gate electrically connected to the second output terminal OUTF, a drain electrically connected to the first output terminal OUT, and a source electrically connected to a supply voltage VDD. The transistor T16 has a gate electrically connected to the first output terminal OUT, a drain electrically connected to the second output terminal OUTF, and a source electrically connected to the supply voltage VDD.

The transistor T21 has a gate configured to receive the feedback signal FB, a source electrically connected to the supply voltage VDD, and a drain electrically connected to the first output terminal OUT. The transistor T22 has a gate configured to receive the feedback signal FB, a source electrically connected to the supply voltage VDD, and a drain electrically connected to the second output terminal OUTF.

The transistor T23 has a gate configured to receive the feedback signal FB, a source electrically connected to the supply voltage VDD, and a drain electrically connected to the first comparison node COM (or the drain of the transistor T11). The transistor T24 has a gate configured to receive the feedback signal FB, a source electrically connected to the supply voltage VDD, and a drain electrically connected to the second comparison node COMF (or the drain of the transistor T12).

Figure 3:
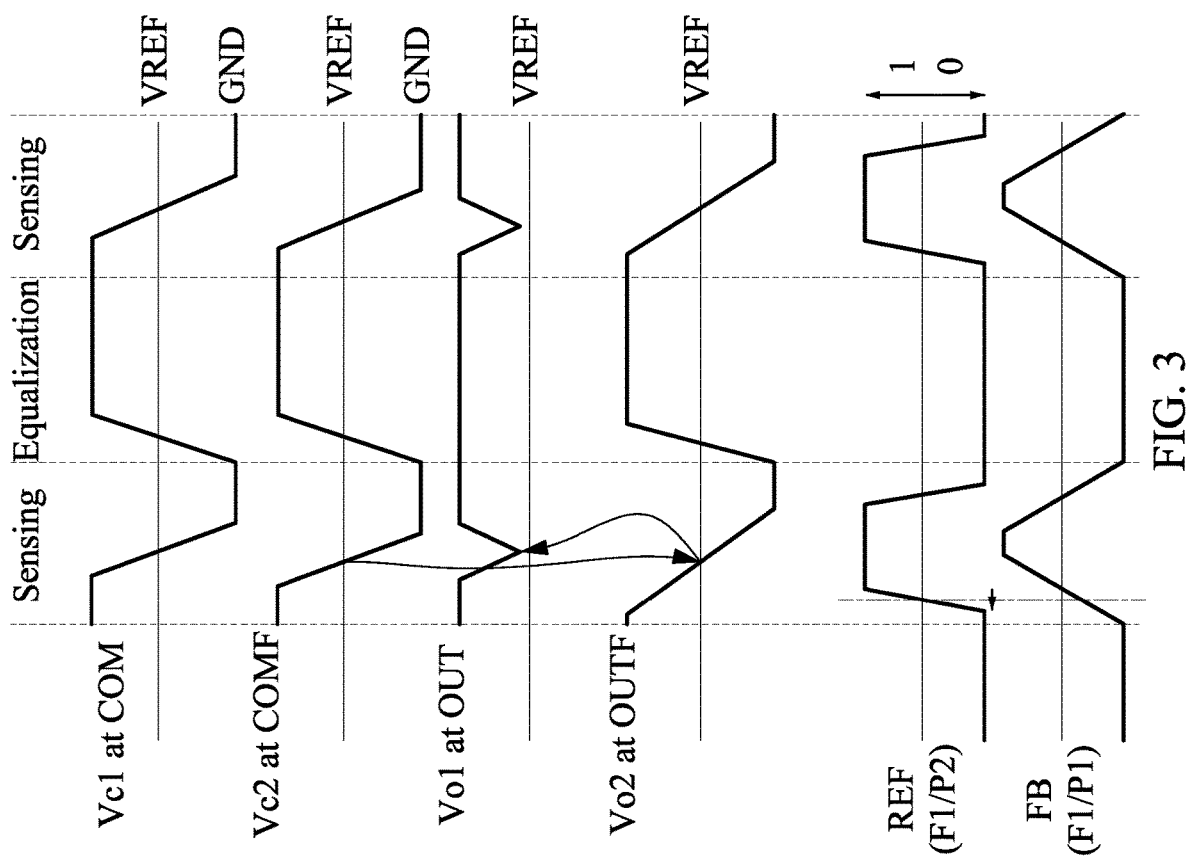
FIG. 3 is a timing diagram of an operation of a phase detector in accordance with some embodiments of the present disclosure.

FIG. 3 is a timing diagram for operation of the phase detector 20 in accordance with some embodiments of the present disclosure. As shown in FIG. 3, the operation of the phase detector 20 includes interleaved sensing and equalization periods. One equalization period may be followed by one sensing period. In some embodiments, the phase detector is under the sensing period when the feedback signal FB is rising, logic high (or has a logic high value, "1"), falling. The phase detector is under the equalization period when the feedback signal FB is logic low (or has a logic low value, "0"). The feedback signal FB and reference signal REF have the same frequency F1.

During the equalization period, the transistor (or p-type transistor) T23 is turned on since the feedback signal FB as received by the gate thereof is logic low value. A voltage Vc1 at the first comparison node COM is subsequently electrically connected to the supply voltage VDD through the transistor T23. In some embodiments, the voltage Vc1 at the first comparison node COM may be pulled up to the supply voltage VDD.

During the equalization period, the transistor (or p-type transistor) T24 is turned on since the feedback signal FB as received by the gate thereof is logic low value. A voltage Vc2 at the second comparison node COMF is subsequently electrically connected to the supply voltage VDD through the transistor T24. In some embodiments, the voltage Vc2 at the second comparison node COMF may be pulled up to the supply voltage VDD.

The transistors T23 and T24 equalize the voltage Vc1 of the first comparison node COM and the voltage Vc2 of the second comparison COMF. The transistor T23 may be referred to as an equalizer. The transistor T24 may be referred to as an equalizer.

During the equalization period, the transistor (or p-type transistor) T21 is turned on since the feedback signal FB as received by the gate thereof is logic low value. A voltage Vo1 at the first output terminal OUT is subsequently electrically connected to the supply voltage VDD through the transistor T21. In some embodiments, the voltage Vo1 at the first output terminal OUT may be pulled up to the supply voltage VDD.

During the equalization period, the transistor (or p-type transistor) T22 is turned on since the feedback signal FB as received by the gate thereof is logic low value. A voltage Vo2 at the second output terminal OUTF is subsequently electrically connected to the supply voltage VDD through the transistor T22. In some embodiments, the voltage Vo2 at the second output terminal OUTF may be pulled up to the supply voltage VDD.

The transistors T21 and T22 equalize the voltage Vo1 of the first output terminal OUT and the voltage Vo2 of the second output terminal OUTF. The transistor T21 may be referred to as an equalizer. The transistor T22 may be referred to as an equalizer.

During the sensing period, the transistors T23 and T24, are turned off, such that the first comparison node COM and the second comparison node COMF are electrically disconnected from the supply voltage VDD. The voltages at the first comparison node COM and the second comparison node COMF will change depending on the feedback signal FB and the reference signal REF. During the sensing period, the transistors T21 and T22 are turned off, such that that the first output terminal OUT and the second output terminal OUTF are electrically disconnected from the supply voltage VDD. The first output terminal OUT and the second output terminal OUTF will change depending on the feedback signal FB and the reference signal REF. The phase detector 20 is configured to determine whether a phase P1 of the feedback signal FB is ahead of or later than a phase P2 of the reference signal REF. The phase detector 20 is configured to compare the phase P1 of the feedback signal FB and the phase P2 of the reference signal REF.

The feedback signal FB is received by the gates of a plurality of transistors (e.g., the transistors T11, T21, T22, T23, T24, and T17). The capacitance and resistance in each of the transistors T11, T21, T22, T23, T24, and T17 may be coupled together. Hence, the input impedance of the phase detector 20 seen by a voltage source (e.g., the data output port 14 of FIG. 1) which generates the feedback signal FB is the equivalent impedance of the capacitance and resistance of the transistors T11, T21, T22, T23, T24, and T17. On the other hand, the reference signal REF is received by the gate of one transistor (e.g., the transistor T12). Therefore, the input impedance of the phase detector 20 seen by the voltage source of the feedback signal FB is different from the input impedance seen by the voltage source of the reference signal REF. In some embodiments, the input impedance of the phase detector 20 seen by the voltage source of the feedback signal FB exceeds that seen by the voltage source of the reference signal REF. The RC time constant at the first input terminal OUT is greater than that at the second input terminal OUTF.

The exemplary timing diagram in FIG. 3 shows that a phase of the feedback signal FB is ahead of a phase of the reference signal REF. In some embodiments, the feedback signal FB starts rising earlier than the reference signal REF. When the feedback signal FB is generated at its voltage source (e.g., the data output port 14), the rise time may be same as that of the reference signal REF. However, owing to the greater input impedance of the phase detector 20 seen by the voltage source of the feedback signal FB, the slope of a rising edge of the feedback signal FB is smaller than that of the reference signal REF. In other words, the rise time of the feedback signal FB is more than that of the reference signal REF. The imbalance between the impedance the input terminals IN1 and IN2 of the phase detector 20 may influence the function of the phase-detection.

In some embodiments, a signal (e.g., a square pulse, a sinusoidal wave, a triangle wave) may be determined as logic high, "1" when it exceeds a half height of the rising edge (or the falling edge) and as logic low, "0" when it is lower than the half height of the rising edge (or the falling edge). In some embodiments, the reference signal REF may be determined as having a logic high value, "1," when the reference signal REF exceeds a half height of the rising edge. The transistor T12 is turned on when receiving the reference signal REF with the logic high value. Subsequently, the transistor T12 is turned on to pull down the second comparison node COMF to the ground GND. In some embodiments, the feedback signal FB may be determined as having a logic high value, "1," when the feedback signal FB reaches a half height of the rising edge. The transistor T11 is turned on when receiving the feedback signal FB with the logic high value. Subsequently, the transistor T11 is turned on to pull down the first comparison node COM to the ground GND.

Although the feedback signal FB starts rising earlier than the reference signal REF, the reference signal REF reaches a half height of its rising edge earlier than the feedback signal FB because the feedback signal has more rise time (or smaller slope of the rising edge). Therefore, the voltage Vc2 at the second comparison node COMF reaches a reference voltage value VREF earlier than the voltage Vc1 at the first comparison node COM.

Figure 5:
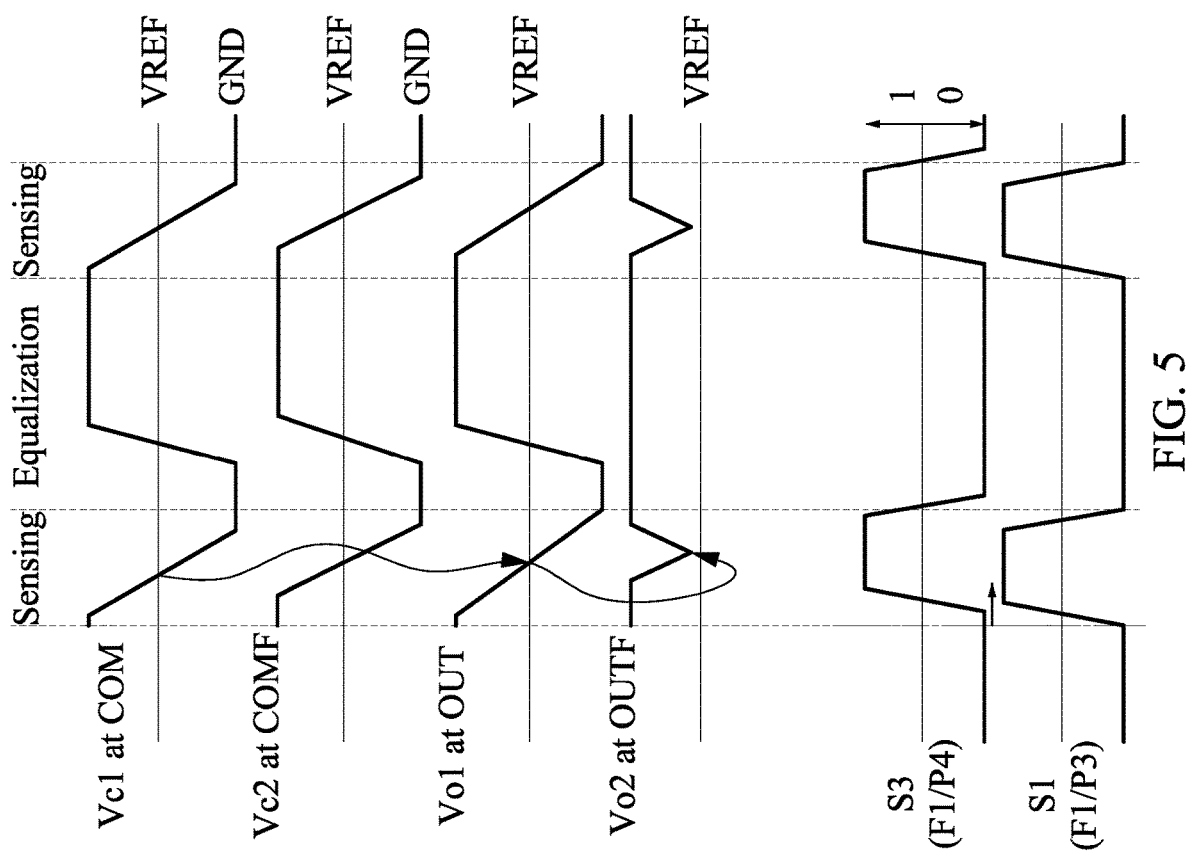
FIG. 5 is a timing diagram of an operation of a phase detector in accordance with some embodiments of the present disclosure.

At the beginning of the sensing period, the voltage Vo1 at the first output terminal OUT falls with the voltage Vc1 at the first comparison node COM. In the meantime, the voltage Vo2 at the second output terminal OUTF falls with the voltage Vc2 at the second comparison node COMF. When the voltage Vc2 at the second comparison node COMF reaches the reference voltage value VREF, the transistor T14 is turned on and the voltage Vo2 at the second output terminal OUTF follows the voltage Vc2 at the second comparison node COMF. The voltage Vo2 at the second output terminal OUTF reaches the ground level (or is pulled down to the ground GND) through the transistors T12 and T14. Subsequently, the gate of the transistor (or the n-type transistor) T13 receives the voltage Vo2 with the ground level (or logic low value, "0") and the transistor T13 is turned off. The gate of the transistor (or the p-type transistor) T15 receives the voltage Vo2 with the logic low value and the transistor T15 is turned on. As shown in FIG. 5, the voltage Vo1 at the first output terminal OUT is electrically connected to the supply voltage VDD through the transistor T15 and reverts to the initial state at the beginning of the sensing period.

The phase detector 20 transmits the output signal OUT1 which represents the voltage Vo1 (logic high value, "1") at the first output terminal OUT to the delay line controller 201. In response to the output signal OUT1, the delay line controller 201 is configured to control the delay line 11 to decrease the delay of the phase of the clock signal CLK2 in FIG. 1, which is associated with the feedback signal FB. Furthermore, the delay line controller 201 may be configured to calculate the difference between the phase P1 of the feedback signal FB and the phase P2 of the reference signal REF. As a result, the phase detector may malfunction whereby the feedback signal FB has an updated phase ahead of that of the reference signal REF in an even greater extent than the original phase.

Figure 4:
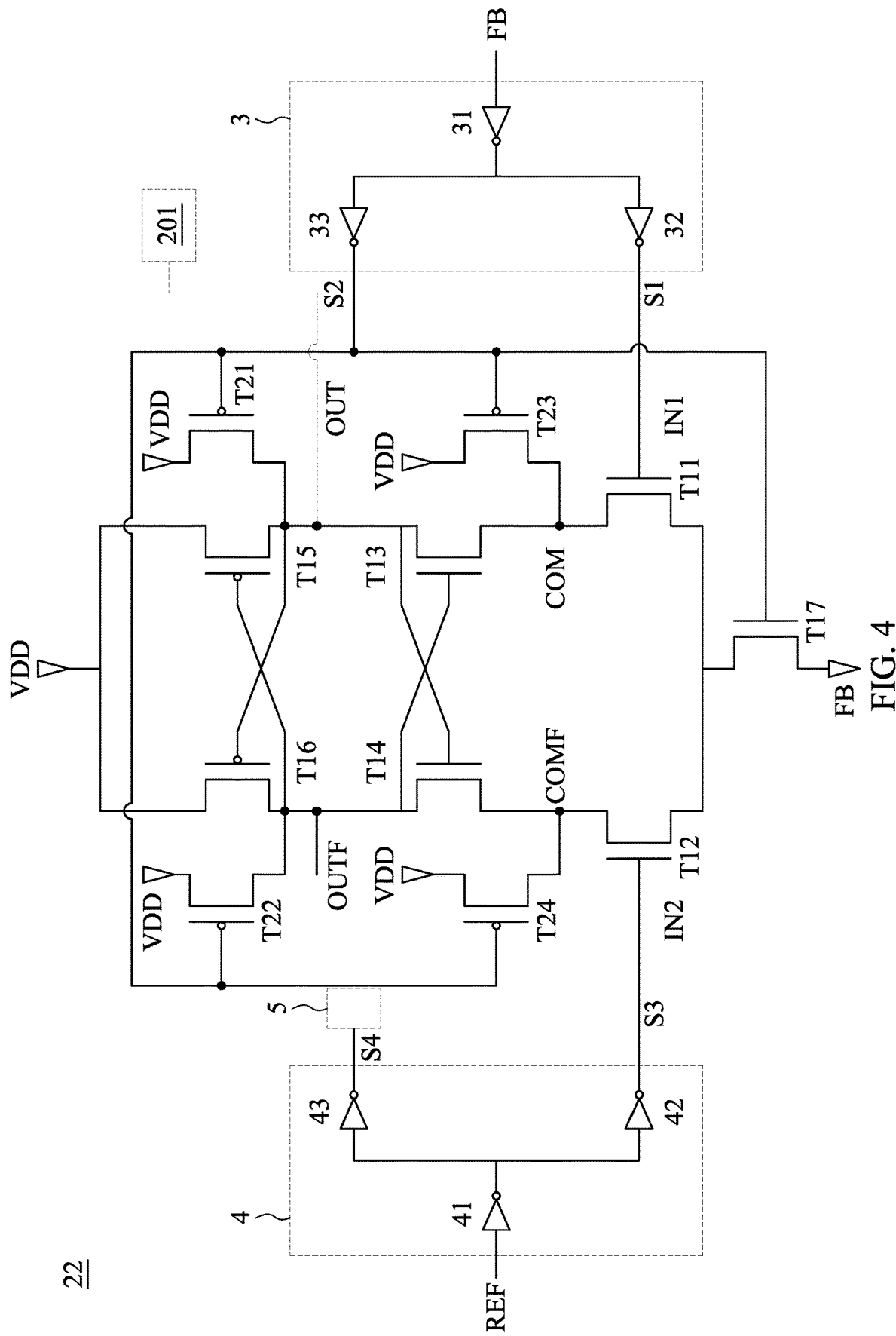
FIG. 4 is a schematic diagram of a phase detector in accordance with some embodiments of the present disclosure.

FIG. 4 is a schematic diagram of a phase detector 22 in accordance with some embodiments of the present disclosure. The characteristics of the elements with the same reference numerals as those in FIG. 2 can refer to the relevant descriptions of FIG. 2. The phase detector 20 of the electronic device 100 of FIG. 1 may be replaced by the phase detector 22 of FIG. 4.

The phase detector 22 further includes an input buffer 3 and an input buffer 4. The input buffer 3 is configured to receive the feedback signal FB. The input buffer 3 is configured to generate a first signal S1 and a second signal S2. The first signal S1, the second signal S2, and the feedback signal FB have the same frequency. The first signal S1 may be isolated from the second signal S2. The input buffer 3 may include inverters 31, 32, and 33. The inverter 31 of the input buffer 3 may include an input port configured to receive the feedback signal FB and an output port electrically connected to an input port of the inverter 32 and an input port of the inverter 33. The inverter 32 has an output port electrically connected to the first input terminal IN1. The inverter 33 has an output port electrically connected to the gates of the transistors T21, T22, T23, T24, and T17.

The input buffer 4 is configured to receive the reference signal REF. The input buffer 4 is configured to generate a third signal S3 and a fourth signal S4. The third signal S3, the fourth signal S4, and the reference signal REF have the same frequency. The third signal S3 may be isolated from the fourth signal S4. The input buffer 4 may include inverters 41, 42, and 43. The inverter 41 of the input buffer 4 may include an input port is configured to receive the reference signal REF and an output port electrically connected to an input port of the inverter 42 and an input port of the inverter 43. The inverter 42 has an output port electrically connected to the second input terminal IN2. The inverter 43 has an output port electrically connected to a dummy load 5. In some embodiments, the phase detector 22 may include the dummy load 5. The dummy load 5 may be a device used to simulate an electrical load.

As shown in FIG. 4, the first input terminal IN1 is connected to the inverter 32 of the input buffer 3. The input buffer 3 is configured to provide the first signal S1 to the first input terminal IN1 through the output port of the inverter 32. The second input terminal IN2 is connected to the inverter 42 of the input buffer 4. The input buffer 4 is configured to provide the third signal S3 to the second input terminal IN2 through the output port of the inverter 42. The input buffer 3 is configured to provide a feedback signal (e.g., the first signal S1) to the first input terminal IN1 and a control signal (e.g., the second signal S2) to control the equalizers T21, T22, T23, T24 and the current source T17. The feedback signal and the control signal provided by the input buffer 3 are isolated from each other. Therefore, the capacitance and resistance at the transistors T21, T22, T23, T24, and T17 will not couple to the input impedance at the first input terminal IN1. Therefore, the input impedance of the first input terminal IN1 seen by the voltage source of the first signal S1 and the input impedance of the second input terminal IN2 seen by the voltage source of the third signal S3 are substantially the same. The input impedance at the first input terminal IN1 and the input impedance of the second input terminal IN2 are substantially the same. The RC time constants at the first input terminal OUT and at the second input terminal OUTF are substantially the same.

In some embodiments, the input buffer 3 and the input buffer 4 provide the same delay time for an input signal thereto. Thus, the phase difference between the feedback signal FB and the first signal S1 and that between the reference signal REF and the third signal S3 may be substantially the same. Therefore, the phase detector 22 can be used to determine the sequence of the feedback signal FB and the reference signal REF by detecting the phase difference of the first signal S1 and the third signal S3. In some embodiments, the input buffer 3 and the input buffer 4 may be identical or symmetrical.

Furthermore, the previous stage of the first input terminal is an inverter of the first input buffer (e.g., an n-type transistor and a p-type transistor). The previous stage of the second input terminal is an inverter of the second input buffer (e.g., an n-type transistor and a p-type transistor). Therefore, the impedance seen by the first input terminal and the impedance seen by the second input terminal are substantially the same.

FIG. 5 is a timing diagram of an operation of the phase detector 23 in accordance with some embodiments of the present disclosure.

As shown in FIG. 5, a phase P3 of the first signal S1 is ahead of a phase P4 of the second signal S2. The first signal S1 starts rising earlier than the second signal S2. The rise time of the first signal S1 and the rise time of the third signal S3 are substantially the same. The slope of a rising edge of the first signal S1 is substantially the same as that of the third signal S3. The first signal S1 reaches and exceeds its half height of the rising edge earlier than the third signal S3. In some embodiments, the first signal S1 may be determined as having a logic high value, "1," when the first signal S1 exceeds a half height of the rising edge. The transistor T11 is turned on when receiving the first signal S1 with the logic high value. Subsequently, the transistor T11 is turned on to pull down the first comparison node COM to the ground GND. In some embodiments, the third signal S3 may be determined as having a logic high value, "1," when the third signal S3 exceeds a half height of the rising edge. The transistor T12 is turned on when receiving the third signal S3 with the logic high value. Subsequently, the transistor T12 is turned on to pull down the second comparison node COMF to the ground GND.

At the beginning of the sensing period, the voltage Vo1 at the first output terminal OUT falls with the voltage Vc1 at the first comparison node COM. In the meantime, the voltage Vo2 at the second output terminal OUTF falls with the voltage Vc2 at the second comparison node COMF. When the voltage Vc1 at the first comparison node COM reaches the reference voltage value VREF, the transistor T13 is turned on and the voltage Vo1 at the first output terminal OUT follows the voltage Vc1 at the first comparison node COM. The voltage Vo1 at the first output terminal OUT reaches the ground level (or is pulled down to the ground GND) through the transistors T11 and T13. Subsequently, the gate of the transistor (or the n-type transistor) T14 receives the voltage Vo1 with the ground level (or logic low value, "0") and the transistor T14 is turned off. The gate of the transistor (or the p-type transistor) T16 receives the voltage Vo1 with the ground level and the transistor T16 is turned on. As shown in FIG. 3, the voltage Vo2 at the second output terminal OUTF is electrically connected to the supply voltage through the transistor T16 and reverts to the initial state at the beginning of the sensing period. In some embodiments, an output signal (e.g., the output signal OUT1) at the first output terminal OUT is complementary to that at the second output terminal OUTF in the sensing period.

The phase detector 20 determines that the phase P3 of the first signal S1 is ahead of the phase P4 of the third signal S3. This determination indicates that the feedback signal FB is earlier than the reference signal REF. The phase detector 20 transmits an output signal OUT1 which represents the voltage Vo1 (logic low value, "0") at the first output terminal OUT to the delay line controller 201. In response to the output signal OUT1, the delay line controller 201 is configured to control the delay line 11 to increase the delay of the phase of the clock signal CLK2 in FIG. 1, which is associated with the feedback signal FB. Furthermore, the delay line controller 201 may be configured to calculate the difference between the phase P1 of the feedback signal FB and the phase P2 of the reference signal REF.

The input buffer 3 electrically connected with the first input terminal IN1 and the input buffer 4 electrically connected with the second input terminal IN2 make the impedance at the first input terminal IN1 and the impedance at the second input terminal IN2 substantially the same. As such, the rise time of the first signal S1 and the third signal S3 are substantially the same. The imbalance between the impedance of the input terminals IN1 and IN2 can be significantly alleviated. As a result, the function of phase detector 22 can be performed correctly and the difference between the phases of the feedback signal FB and the reference signal REF is reduced. During a plurality of cycles of the sensing period and the equalization period, the feedback signal FB and the reference signal REF may be synchronized or nearly synchronized.

FIG. 5 illustrates the operation of the phase detector 22 when the phase P3 of the first signal S1 is ahead of the phase P4 of the third signal S3 (e.g., the phase P1 of the feedback signal FB is ahead of the phase P2 of the reference signal REF). In some embodiments, the operation of the phase detector 22 when the phase P3 of the first signal S1 is later than the phase P4 of the third signal S3 is similar to those as discussed previously. The difference is that the voltage at the first output terminal OUT may be pulled up to the supply voltage; the voltage at the second output terminal OUTF may be pulled down to the ground GND; and the phase detector 22 may transmit an output signal with the logic high value, "1," to the delay line controller 201. Subsequently, the delay line controller 201 may be configured to control the delay line 11 to decrease the delay of the phase of the clock signal CLK2 in FIG. 1. The difference between the phases of the feedback signal FB and the reference signal REF is reduced. During a plurality of cycles of the sensing period and the equalization period, the feedback signal FB and the reference signal REF may be synchronized or nearly synchronized.

Figure 6:
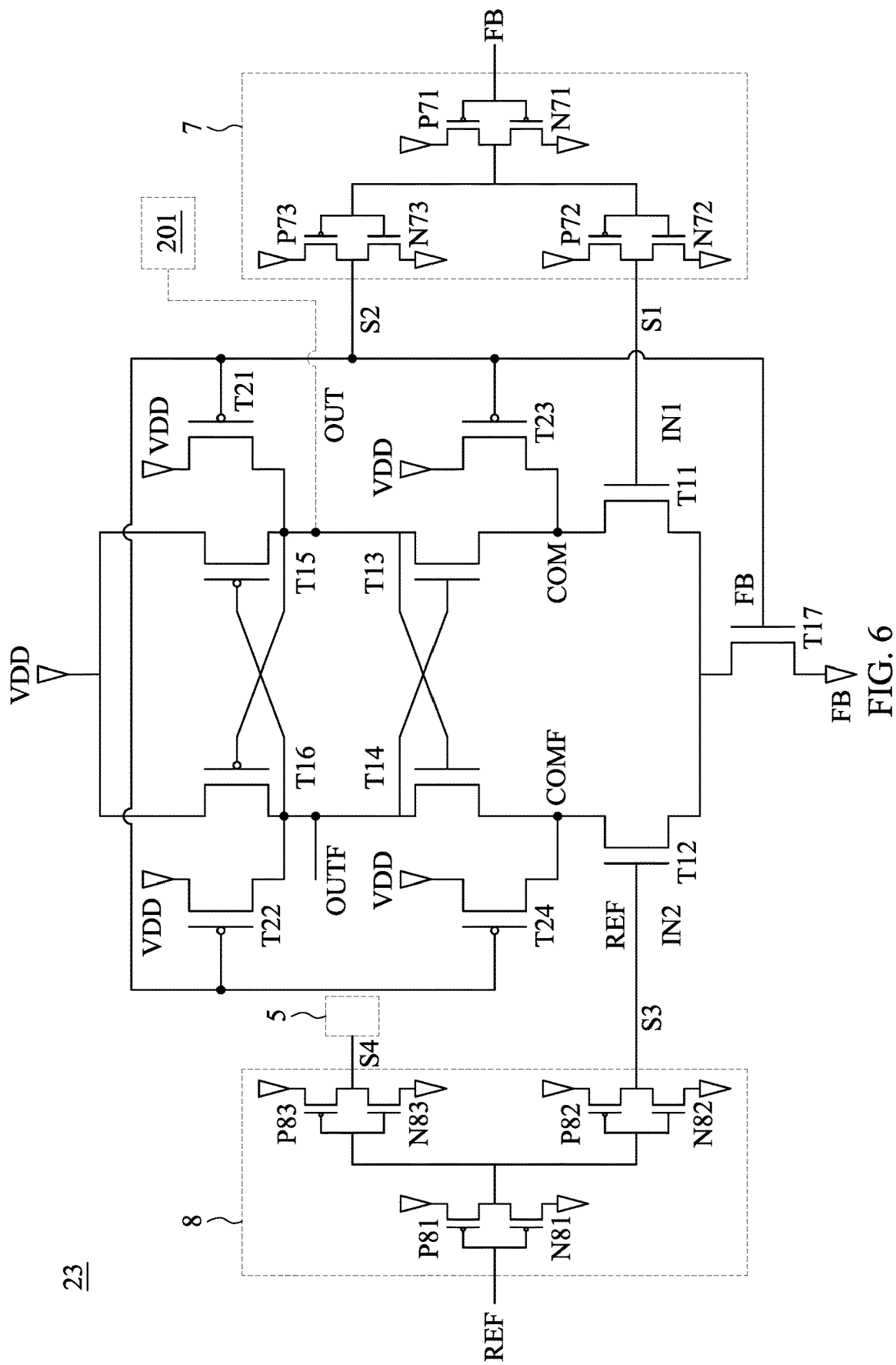
FIG. 6 is a schematic diagram of a phase detector in accordance with some embodiments of the present disclosure.

FIG. 6 is a schematic diagram of a phase detector 23 in accordance with some embodiments of the present disclosure. The characteristics of the elements with the same reference numerals as those in FIG. 2 can be referred to the relevant descriptions of FIG. 2. The phase detector 20 of the electronic device 100 of FIG. 1 may be replaced by the phase detector 23 of FIG. 6.

The phase detector 23 further includes an input buffer 7 and an input buffer 8. The input buffer 7 is configured to receive the feedback signal FB. The input buffer 7 is configured to generate a first signal S1 and a second signal S2. The first signal S1 may be isolated from the second signal S2.

The input buffer 7 includes an n-type transistor N71 and a p-type transistor P71. The n-type transistor N71 has a gate electrically connected to a gate of the p-type transistor P71 and configured to receive the feedback signal FB. The n-type transistor N71 has a source electrically connected to the ground GND and a drain electrically connected to a drain of the p-type transistor P71. The p-type transistor P71 has a source electrically connected to the supply voltage VDD. The n-type transistor N71 and the p-type transistor P71 may be referred to as an inverter configured to invert the feedback signal FB.

The input buffer 7 has an n-type transistor N72 and a p-type transistor P72. The n-type transistor N72 has a gate electrically connected to a gate of the p-type transistor P72 and configured to receive the inverted feedback signal FB. The n-type transistor N72 has a source electrically connected to the ground GND and a drain electrically connected to a drain of the p-type transistor P72. The p-type transistor P72 has a source electrically connected to the supply voltage VDD. The drains of the n-type transistor N72 and the p-type transistor P72 are electrically connected to the first input terminal IN1. The n-type transistor N72 and the p-type transistor P72 may be referred to as an inverter configured to invert the inverted feedback signal FB and generate the first signal S1 to the first input terminal IN1.

The input buffer 7 has an n-type transistor N73 and a p-type transistor P73. The n-type transistor N73 has a gate electrically connected to a gate of the p-type transistor P73 and configured to receive the inverted feedback signal FB. The n-type transistor N73 has a source electrically connected to the ground GND and a drain electrically connected to a drain of the p-type transistor P73. The p-type transistor P73 has a source electrically connected to the supply voltage VDD. The drains of the n-type transistor N73 and the p-type transistor P73 are electrically connected to the gate of the transistors T21, T22, T23, T24, and T17. The n-type transistor N73 and the p-type transistor P73 may be referred to as an inverter configured to invert the inverted feedback signal FB and generate the second signal S2 to the gates of the transistors T21, T22, T23, T24, and T17.

By generating two individual signals (the first signal and the second signal), the first input terminal is decoupled from the transistors T21, T22, T23, T24, and T17 in the phase detector 23.

The input buffer 8 includes an n-type transistor N81 and a p-type transistor P81. The n-type transistor N81 has a gate electrically connected to a gate of the p-type transistor P81 and configured to receive the reference signal REF. The n-type transistor N81 has a source electrically connected to the ground GND and a drain electrically connected to a drain of the p-type transistor P81. The p-type transistor P81 has a source electrically connected to the supply voltage VDD. The n-type transistor N81 and the p-type transistor P81 may be referred to as an inverter configured to invert the reference signal REF.

The input buffer 8 has an n-type transistor N82 and a p-type transistor P82. The n-type transistor N82 has a gate electrically connected to a gate of the p-type transistor P82 and configured to receive the inverted reference signal REF. The n-type transistor N82 has a source electrically connected to the ground GND and a drain electrically connected to a drain of the p-type transistor P82. The p-type transistor P82 has a source electrically connected to the supply voltage VDD. The drains of the n-type transistor N82 and the p-type transistor P82 are electrically connected to the second input terminal IN2. The n-type transistor N82 and the p-type transistor P82 may be referred to as an inverter configured to invert the inverted reference signal REF and generate the second signal S3 to the second input terminal IN2.

The input buffer 8 has an n-type transistor N83 and a p-type transistor P83. The n-type transistor N83 has a gate electrically connected to a gate of the p-type transistor P83 and configured to receive the inverted reference signal REF. The n-type transistor N83 has a source electrically connected to the ground GND and a drain electrically connected to a drain of the p-type transistor P83. The p-type transistor P83 has a source electrically connected to the supply voltage VDD. The drains of the n-type transistor N83 and the p-type transistor P83 are electrically connected to a dummy load 5. The n-type transistor N83 and the p-type transistor P83 may be referred to as an inverter configured to invert the inverted reference signal REF and generate the fourth signal S4 to the dummy load 5.

The input impedance of the first input terminal IN1 seen by the voltage source of the first signal S1 and the input impedance of the second input terminal IN2 seen by the voltage source of the third signal S3 are substantially the same. Therefore, the rise time of the first signal S1 and the third signal S3 are substantially the same. The imbalance between the first input terminal and the second input terminal can be alleviated.

In some embodiments, the previous stage of the first input terminal IN1 is the n-type transistor N72 and the p-type transistor P72. The previous stage of the second input terminal IN2 is the n-type transistor N82 and the p-type transistor P82. Therefore, the impedance seen by the first input terminal and the impedance seen by the second input terminal are substantially the same.

In some embodiments, the input buffer 7 and the input buffer 8 provide substantially the same delay time for an input signal thereto. Thus, the phase difference between the feedback signal FB and the first signal S1 and that between the reference signal REF and the third signal S3 may be substantially the same. Therefore, the phase detector 23 can be used to determine the sequence of the feedback signal FB and the reference signal REF by detecting the phase difference of the first signal S1 and the third signal S3.

Figure 7:
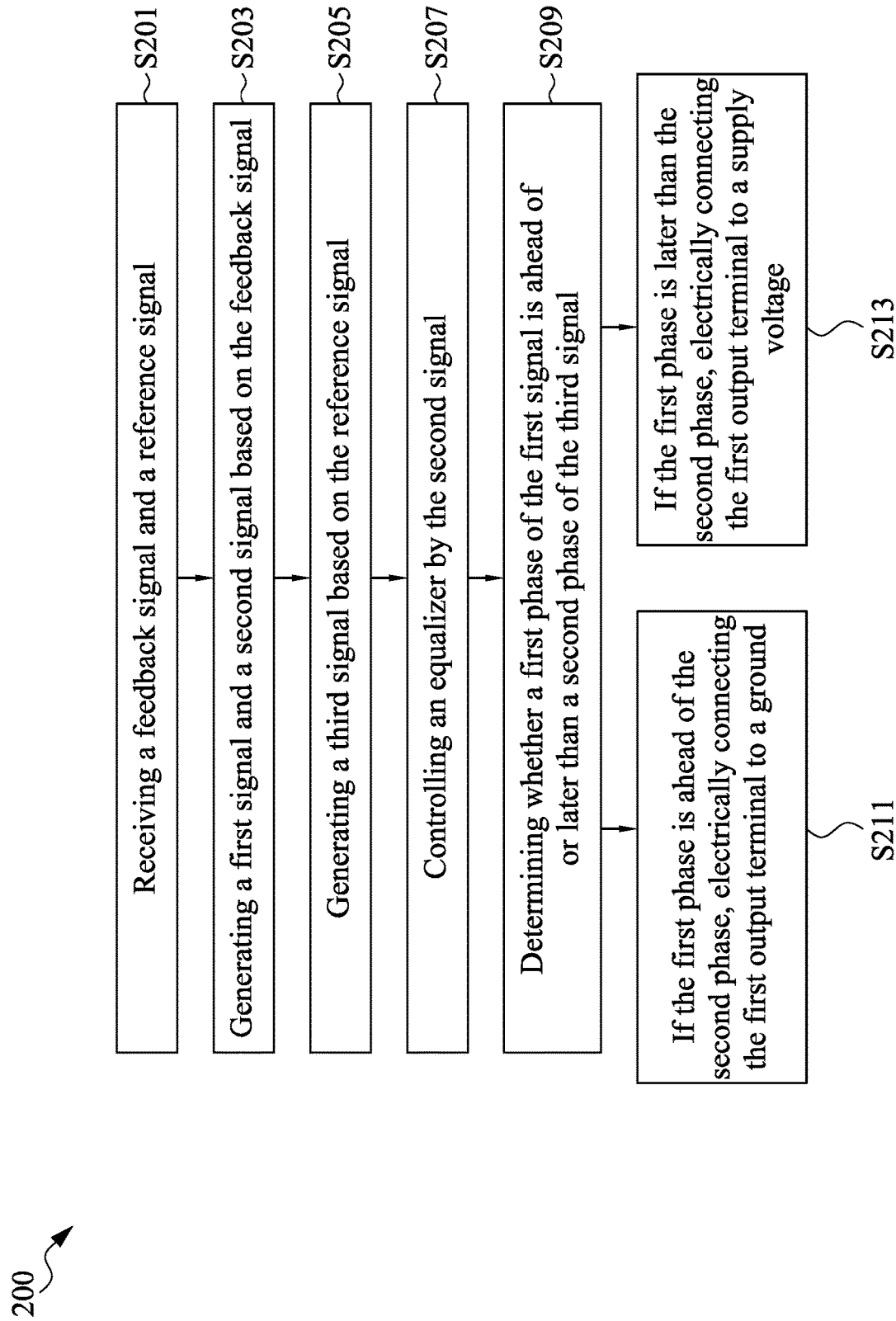
FIG. 7 is a flowchart of a method of controlling a phase detector, in accordance with some embodiments of the present disclosure.

FIG. 7 is a flowchart of a method 200 of controlling a phase detector (e.g. the phase detector 22 or 23) in accordance with some embodiments of the present disclosure.

The method 200 begins with operation S201 comprising receiving a feedback signal and a reference signal. The feedback signal is received by a first input buffer (e.g., the input buffer 3 or the input buffer 7). The reference signal is received by a second input buffer (e.g., the input buffer 4 or the input buffer 8).

The method 200 continues with operation S203 comprising generating a first signal and a second signal based on the feedback signal. The first signal and the second signal are generated by the first input buffer (e.g., the input buffer 3 or the input buffer 7). The first signal and the feedback signal have the same frequency.

The method 200 continues with operation S205 comprising generating a third signal based on the reference signal. The third signal is generated by the second input buffer (e.g., the input buffer 4 or the input buffer 8). The third signal and the reference signal have the same frequency.

The method 200 continues with operation S207 comprising controlling an equalizer (e.g., the equalizer T21, T22, T23, or T24) by the second signal. Controlling the equalizer includes turning on the equalizer to electrically connect a node (the comparison nodes COM, COMF, or the output terminals OUT or OUTF) to a supply voltage (e.g., the supply voltage VDD) during an equalization period. Controlling the equalizer includes turning off the equalizer to electrically disconnect the node from the supply voltage. The equalizer is decoupled by the first input buffer.

The method 200 continues with operation S209 comprising determining whether a first phase of the first signal is ahead of or later than a second phase of the third signal. The first input buffer and the second input buffer have same delay time. Therefore, the determination of the phase difference between the first signal and third signal indicates the phase difference between the feedback signal and the reference signal.

Operation S211 comprises, if the first phase is ahead of the second phase, electrically connecting the first output terminal to a ground.

Operation S213 comprises, if the first phase is later than the second phase, electrically connecting the first output terminal to a supply voltage.

The method 200 may further comprise transmitting an output signal (e.g., the output signal OUT1) representing the voltage at the first output terminal to the next stage (e.g., the delay line controller 201).

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 7. In some embodiments, the method 200 can include one or more operations depicted in FIG. 7.

One aspect of the present disclosure provides a phase detector including a first input terminal, a second input terminal, a first input buffer, and a second input buffer. The first input buffer is electrically connected to the first input terminal. The second input buffer is electrically connected to the second input terminal.

Another aspect of the present disclosure provides a phase detector including a first input buffer, a second input buffer, a first input terminal, a second input terminal, a first equalizer. The first input buffer is configured to receive a feedback signal and generate a first signal and a second signal. The second input buffer is configured to receive a reference signal and generate a third signal. The second input terminal is configured to receive the third signal. The first equalizer is configured to receive the second signal.

Another aspect of the present disclosure provides an electronic device including a receiver, a delay line, a data output port, and a phase detector. The receiver is configured to receive a reference clock signal and generate a first signal and a reference signal. The delay line is electrically connected to the receiver and configured to adjust the phase of the first signal to generate a second signal. The data output port is electrically connected to the delay line and providing a feedback signal associated with the second signal. The phase detector is electrically connected to the data output port and the delay line. The phase detector a first input terminal, a second input terminal, a first input buffer, and a second input buffer. The first input buffer is electrically connected to the first input terminal and configured to receive the feedback signal. The second input buffer is electrically connected to the second input terminal and configured to receive the reference signal.

The phase detector of the present disclosure includes a first transistor having a first input buffer electrically connected to a first input terminal and a second input buffer electrically connected to a second input terminal. The phase detector is configured to determine whether the phase of a feedback signal is ahead of or later than the phase of a reference signal. The feedback signal and the reference signal have the same frequency but different phases. The first input buffer is configured to receive the feedback signal and the second input buffer is configured to receive the reference signal. The second input buffer is configured to generate a third signal for the second input terminal based on the reference signal. The first input buffer is configured to, based on the feedback signal, generate a first signal for the first input terminal and a second signal for other transistors (e.g., equalizers) of the phase detector. By generating two individual signals (the first signal and the second signal), the first input terminal is decoupled from other transistors in the phase detector. Therefore, the input impedance at the first input terminal and the input impedance at the second input terminal are the same. Imbalance between the first input terminal and the second input terminal can be alleviated or eliminated. The phase detector determines whether the phase of the first signal is ahead of or later than the phase of the third signal. This determination directly indicates which of the feedback signal and the reference signal is earlier than the other. The phase detector of the present disclosure can correctly provide an output signal to the next stage (e.g., a delay line controller) to adjust the delay of output clocks.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A phase detector, comprising:
   a first input buffer configured to receive a feedback signal and generate a first signal and a second signal;
   a second input buffer configured to receive a reference signal and generate a third signal;
   a first input terminal configured to receive the first signal;
   a second input terminal configured to receive the third signal;
   a first equalizer configured to receive the second signal;
   a first transistor having a gate as the first input terminal, a source electrically connected to a ground, and a drain electrically connected to the first equalizer;
   a second equalizer configured to receive the second signal; and
   a second transistor having a gate as the second input terminal, a source electrically connected to a ground, and a drain electrically connected to the second equalizer;
   wherein the first equalizer is configured to:
   (i) during an equalization period, be turned on to electrically connect the drain of the first transistor to a supply voltage; and
   (ii) during a sensing period, be turned off to electrically disconnect the drain of the first transistor from the supply voltage.

2. The phase detector of claim 1, wherein the second equalizer is configured to:
   (iii) during an equalization period, be turned on to electrically connect the drain of the second transistor to the supply voltage; and
   (iv) during a sensing period, be turned off to electrically disconnect the drain of the second transistor from the supply voltage.

3. The phase detector of claim 1, further comprising:
   a third transistor having a drain as a first output terminal, a source electrically connected to the drain of the first transistor; and
   a third equalizer electrically connected to the first output terminal and configured to receive the second signal.

4. The phase detector of claim 3, wherein the third equalizer is configured to:
   (i) during the equalization period, be turned on to electrically connect the first output terminal to the supply voltage; and
   (ii) during the sensing period, be turned off to electrically disconnect the first output terminal from the supply voltage.

5. The phase detector of claim 4, further comprising:
   a fourth transistor having a drain as a second output terminal, a source electrically connected to the drain of the first transistor; and
   a fourth equalizer electrically connected to the second output terminal and configured to receive the second signal.

6. The phase detector of claim 5, wherein the fourth equalizer is configured to:
   (iii) during the equalization period, be turned on to electrically connect the second output terminal to the supply voltage; and
   (iv) during the sensing period, be turned off to electrically disconnect the second output terminal from the supply voltage.

7. The phase detector of claim 1, wherein the input impedance at the first input terminal and the input impedance at the second input terminal are the same.

* * * * *